United States Patent [19]

Ferguson

[11] Patent Number: 5,138,252
[45] Date of Patent: Aug. 11, 1992

[54] AUTOMATIC SCALING FOR DISPLAY OF MODULATION DOMAIN MEASUREMENTS

[75] Inventor: Keith M. Ferguson, Saratoga, Calif.
[73] Assignee: Hewlett-Packard Company, Palo Alto, Calif.
[21] Appl. No.: 760,788
[22] Filed: Sep. 16, 1991

Related U.S. Application Data

[63] Continuation of Ser. No. 612,036, Nov. 9, 1990, Pat. No. 5,072,168.

[51] Int. Cl.$^5$ .......................................... G01R 23/16
[52] U.S. Cl. .............................. 324/77 B; 324/115; 324/121 R; 324/77 R; 395/140
[58] Field of Search ............... 395/140, 102; 324/121 R, 115, 77 B, 77 C, 77 R; 364/485, 484

[56] References Cited

U.S. PATENT DOCUMENTS

| | | | |
|---|---|---|---|
| 3,204,144 | 8/1965 | Deavenport | 324/115 |
| 3,581,199 | 5/1971 | Spitz | 324/77 R |
| 4,236,151 | 11/1980 | Russ | 324/71.4 |
| 4,743,844 | 5/1988 | Odenheimer | 324/115 |
| 4,764,721 | 8/1988 | Slavin | 324/115 |
| 4,825,449 | 4/1989 | McKissock | 395/140 |
| 5,072,168 | 12/1991 | Ferguson | 324/77 B |

Primary Examiner—Walter E. Snow
Assistant Examiner—Jose M. Solis

[57] ABSTRACT

A method for examining an input signal and setting a modulation domain measuring instrument to a state which will produce a measurement and a stable, centered, properly scaled display of the signal, automatically. After finding the 50 percent voltage threshold of the input signal, an iterative process determines the minimum and maximum input frequency, then checks the ratio of these two frequencies against instruments limits, and adjusts the display values, if necessary to show only the higher frequencies. The method then varies the measurement parameters to seek the best frequency resolution while maintaining the measurement and display of frequency modulation. The display frequency scale is set to display the signal in the center half of the display, using values with no more than two significant digits for the center and span. The time scale is set to display a selected number of modulation cycles.

3 Claims, 5 Drawing Sheets

— 5,138,252 —

AUTOMATIC SCALING FOR DISPLAY OF MODULATION DOMAIN MEASUREMENTS

CROSS REFERENCE TO RELATED APPLICATIOIN

This is a continuation of application Ser. No. 07/612,036, filed Nov. 9, 1990, and issued Dec. 10, 1991 as U.S. Pat. No. 5072,168.

FIELD OF THE INVENTION

The invention relates generally to measuring and displaying signal attribute measurement data, and in particular to automatically setting measurement parameters and scaling display parameters for frequency measurement data for time varying signals, e.g., frequency modulated signals. One application of the invention is in producing a display of frequency versus time measurements for a signal with dynamic frequency. Another application of the invention is in producing a histogram display showing the frequency distribution of a set frequency measurements.

BACKGROUND OF THE INVENTION

To analyze the behavior of a signal over a period of time, a block of time-related measurements is taken. A display of amplitude measurements versus time will produce a waveform of the signal's behavior.

Continuous time interval measurements on a signal provide a way to analyze characteristics of the signal in the modulation, i.e., the behavior of the frequency or phase of the signal versus time. This is different than classic ways of measuring and displaying data about signals. An oscilloscope shows amplitude versus time: the time domain. A spectrum analyzer shows amplitude versus frequency: the frequency domain.

Continuous time interval measurements make it similer to study dynamic frequency behavior of a signal: frequency drift over time of an oscillator, the frequency hopping performance of an angle transmitter, chirp linearity and phase switching in radar systems.

An example of an instructment that generates this type of time stamp and continuous time interval data is described in "Frequency and Time Interval Analyzer measurement Hardware", Paul S. Stephenson Hewlett-Packard Journal, Vol, 40, No. 1, Feb., 1989.

Instead of a traditional frequency counter's numeric display, the modulation domain analyzer uses a graphic display of frequency versus time to efficiently communicate the far greater information bandwidth to the operator. The change is analogous to the change from a voltmeter to an oscilloscope of voltage versus time measurements.

The measurement setup requirements for making and displaying a measurement in the modulation domain are potentially more confusing and intimidating for the operator, and therefore a method for automatically scaling the instrument parameters and the display for a particular input signal ais desirable to make the instrument easier to use.

In measuring frequency modulated signals, there can be a tradeoff between using a measurement setup that gives the best resolution of the signal's frequency and a measurement setup that gives the best data of the dynamic behavior of the frequency. For a slowly modulated signal, measuring the frequency over a large number of cycles gives better resolution of the frequency. However, for a rapidly modulated signal, measuring over too many cycles can average out the modulation.

SUMMARY OF THE INVENTION

The invention is a method for examining an input signal and setting a frequency measuring instrument to a state which will produce a measurement and a display of that signal. The method of the invention examines the input signal and attempts to set the instrument to a state which will produce a stable, centered, properly scaled display of the signal, automatically.

Throughout the process, the system of the invention automatically changes only those parameters necessary to make a valid measurement and to present a meaningful display to the user, and leaves unchanged other parameters the user may have intentionally set.

The method uses aa multistep process for determining values for the vertical frequency scale and the horizontal time scale of the display. These values can be used to determine the measurement parameters for either a frequency versus time display of a histogram display.

After finding the 50 percent voltage threshold on whichever input channel is being used, the system performs an interactive process to determine the minimum and maximum input frequency. It then checks the ratio of these two frequencies against instruments limits, and adjusts the display values, if necessary to show only the higher frequencies. It then seeks the best frequency resolution while maintaining the measurement and display of frequency modulation. The system attempts to display the signal in the center half of the display, and tries to use values with no more than two significant digits for the center and span.

Lastly, the horizontal time per division is set to display approximately four cycles of the modulation, if possible.

The automatic scaling method for time-interval measurements follows a similar process.

DESCRIPTION OF A PREFERRED EMBODIMENT

Figure 1:
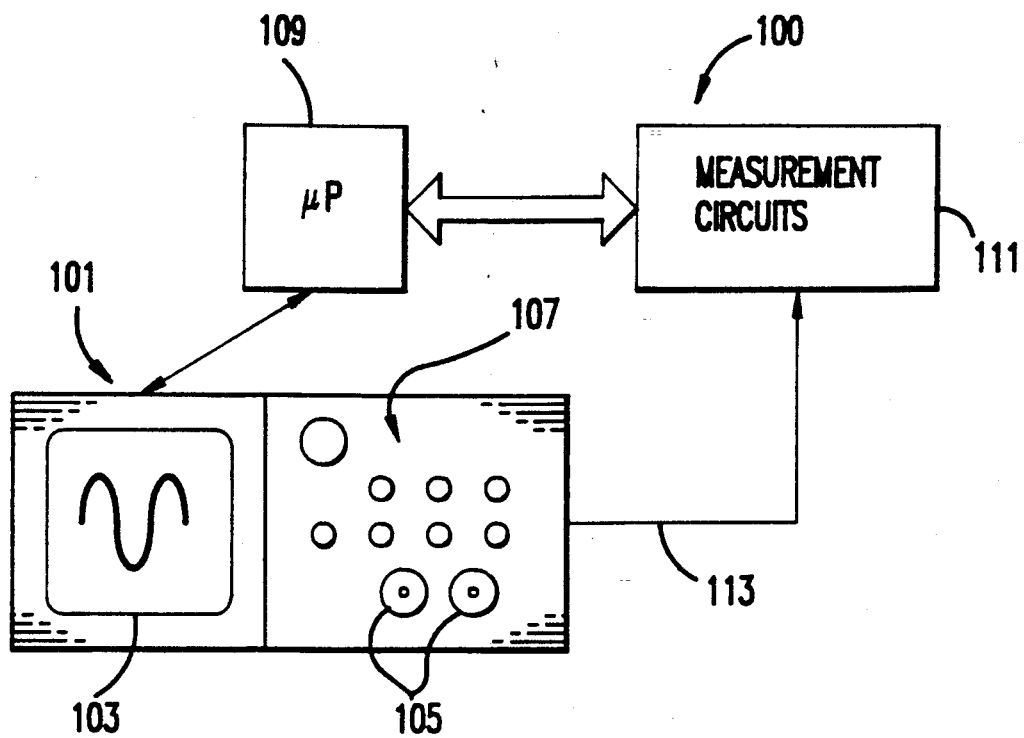
FIG. 1 shows a schematic block diagram of a modulation domain measurement instrument 100 of the kind using the automatic scaling method of the invention.
Figure 5:
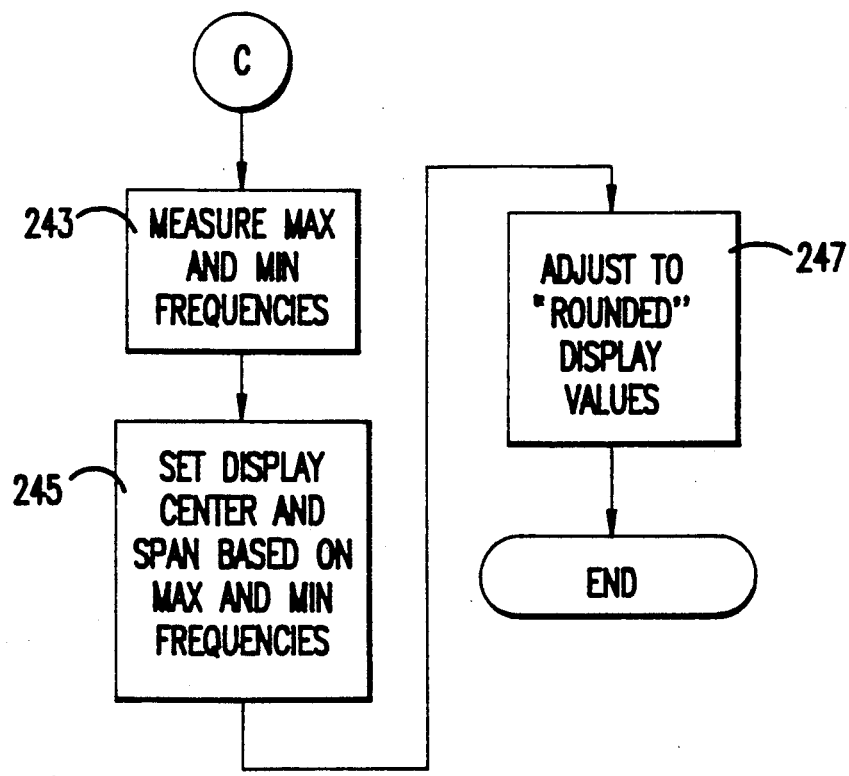
FIGS. 2, 3, 4 and 5 show a flow chart illustrating the operation of the invention to set the measurement parameters of the instrument and to set the vertical (frequency per division) scale of the display of the instrument.

FIG. 1 shows a schematic block diagram of a modulation domain measurement instrument 100 of the kind using the automatic scaling method of the invention. The front panel 101 of the instrument has a display 103, signal input ports 105 and user input buttons 107. A microprocessor 109 controls the instrument in response to input selections made by the user. Measurement circuits 111 receive the input signal on line 113, and measure the frequency of the signal, sending the frequency data to a memory accessible to microprocessor 109. Certain parameters for the measurement operation, in particular the duration of the "measurement gate", the period during which a frequency measurement is made, can be controlled by microprocessor 109. By controlling the duration of the measurement gate, the instrument can be set to make the best compromise between measuring frequency resolution and measuring modulation on a given input signal.

The measurement circuit 111 capture information from an input signal, and preprocess the data extracted from the input signal. The measurement circuits 111 include counters that produce time and event stamps and processors to perform operations on the data that result in either instantaneous frequency or time-interval. The frequency is the difference between corresponding event stamp values divided by the difference between successive time stamp values, cycles divided by time. The results are stored in memory, available for further processing and graphical display by the processor 109.

The measurement circuits 111 can operate in a mode called constant event mode, in which the duration of the measurement gate is set to a predetermined number of events, i.e., input signal cycles. This mode is used for the automatic scaling method of the invention.

Microprocessor 109 processes the frequency measurement data to produce a display of the frequency versus time behavior of the input signal on the display 103. In order to best display the measurement data on the disply, the maximum and minimum values for the two axes, frequency and time should be set based on the measurement data.

Figure 6:
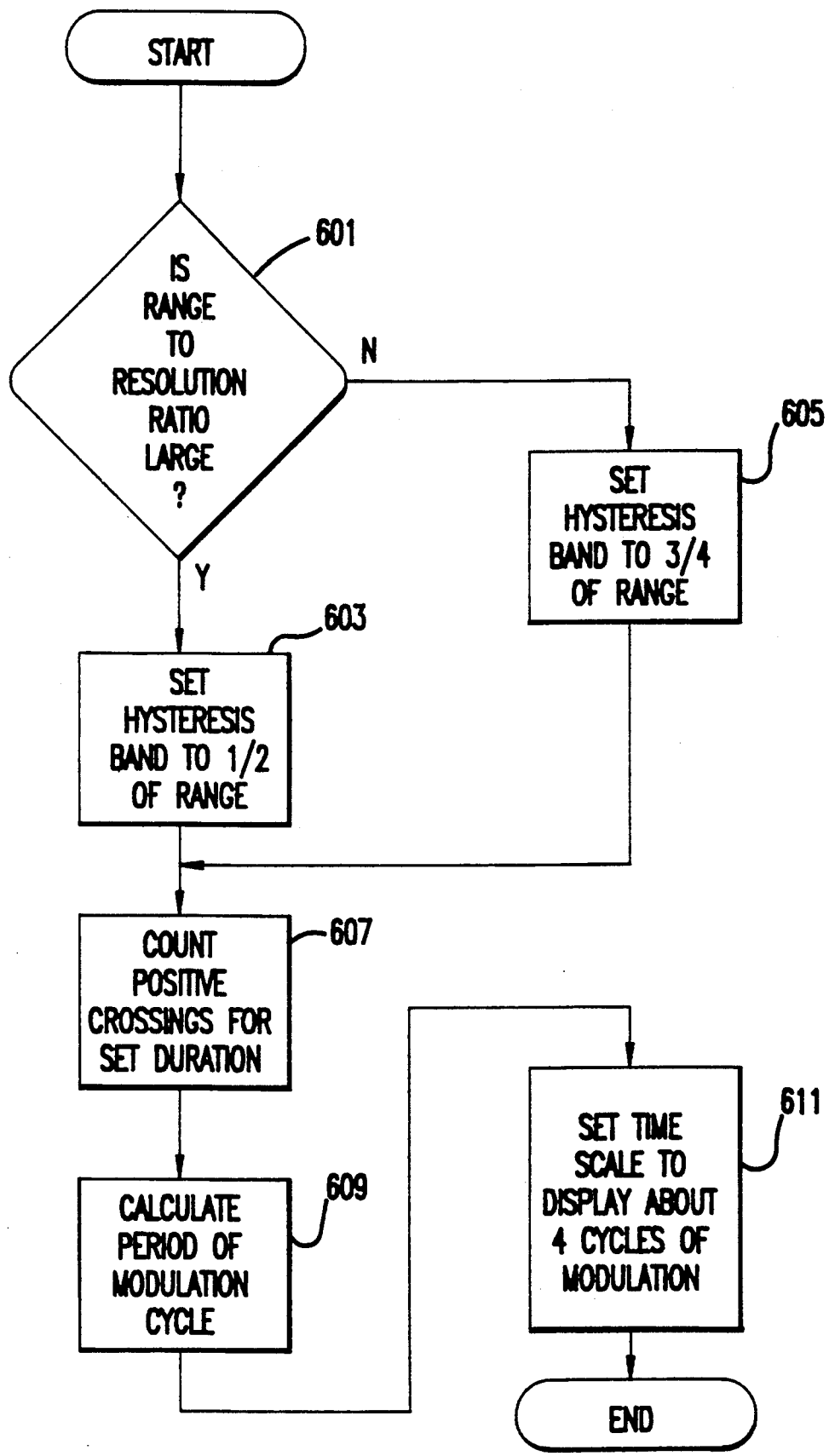
FIG. 6 shows a flow chart illustrating the operation of the invention to set the horizontal (time per division) scale of the display of the instrument.

The operation of microprocessor 109 to perform the automatic scaling method of the invention, to set the parameters of the measurement circuits 111 and the parameters of the display 103 is described in more detail below, in connection with the flow chart shown in FIGS. 2, 3, 4, 5, and 6. FIGS. 2, 3, 4 and 5 show the operation to set the measurement parameters and to set the vertical (frequency per division) scale of display 103. FIG. 6 shows the operation to set the horizontal (time per division) scale of display 103.

Figure 2:
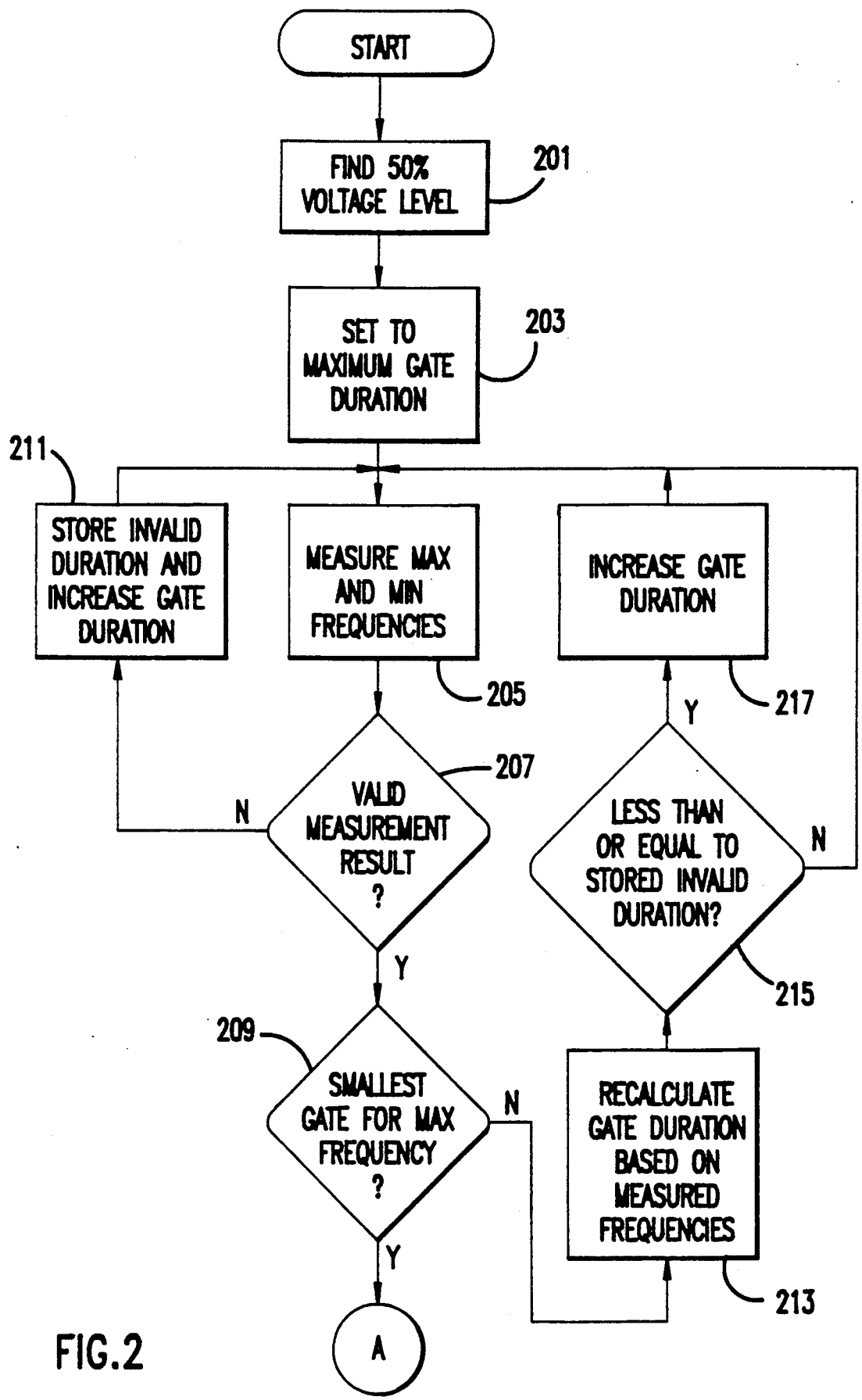

Referring to FIG. 2, the first step, 201 is to find the 50% voltage threshold on the input signal. This operation is performed similarly to the way an oscilloscope finds the center of an input signal.

Step 201 is important if the modulation domain analyer instrument 100 will be measuring input signals with differing voltage ranges.

For operation with input signals having a known voltage range, or a known center voltage, step 201 is not necessary. For example, in an instrument designed to measure only TTL logic output signals, the input signal voltage threshold of the instrument can be set at 1.5 volts. Similarly, may RF signals are AC coupled, and the customary termination inpedance is 50 ohms to ground, so in an instrument designed to measure only these signals the voltage thereshold can be set to zero volts.

Therefore, although step 201 is included in the preferred embodiment to provide the greatest flexibility of measurement for the instrument 100, it will be recognized that step 201 can be eliminated in lower cost instruments with less flexibility.

Next, in steps 203-225, is to find the minimum and maximum input frequency. This is an iterative process, In step 203 the processor sets the measurement circuits in constant event mode to a number of events that provides an initial gate duration large enough to ensure that a valid measurement will be made at any frequency up to the maximum for the instrument. As will be explained below, the measurement gate duration is subsequently changed by varying number of events over which the constant event measurements are made.

In step 205 the circuits perform a constant event, two stamp, continuous, frequency measurement. Only the minimum and maximum frequency values are recorded.

In step 207, the result is tested to determine if a valid measurement was made. If step 207 finds the result is not a valid measurement, too small a gate duration was used, so that invalid gate duration is stored and the gate duration is increased in step 211 before making another measurement. If step 207 finds a valid result, control flows to step 213 via decision step 209, and the processor recalculates the gate duration using the maximum frequency detected in step 205. In step 215 this new gate duration is checked against previous gate durations that yielded invalid mesurements. If the new gate duration is less that or equal to a gate duration that yielded an invalid measurement the gate duration is increased in step 217. Then the measurement of step 205 is repeated. As long as a valid measurement results, steps 205, 213, 215 and 217 are repeated, calculating a gate duration after each measurement iteration, until the smallest number is found permitting a valid measurement, at the frequency measured, as test in step 209.

In the terminology of a traditional frequency counter, steps 203 to 217 find the minimum gate duration that the instrument can use to measure the frequency of input signal. Although measuring at the minimum gate duration reduces the resolution of the frequency measurement, it improves the chances of finding the maximum and minimum values for signals modulated at high rate (a longer gate time would average out more of the modulation).

Figure 3:
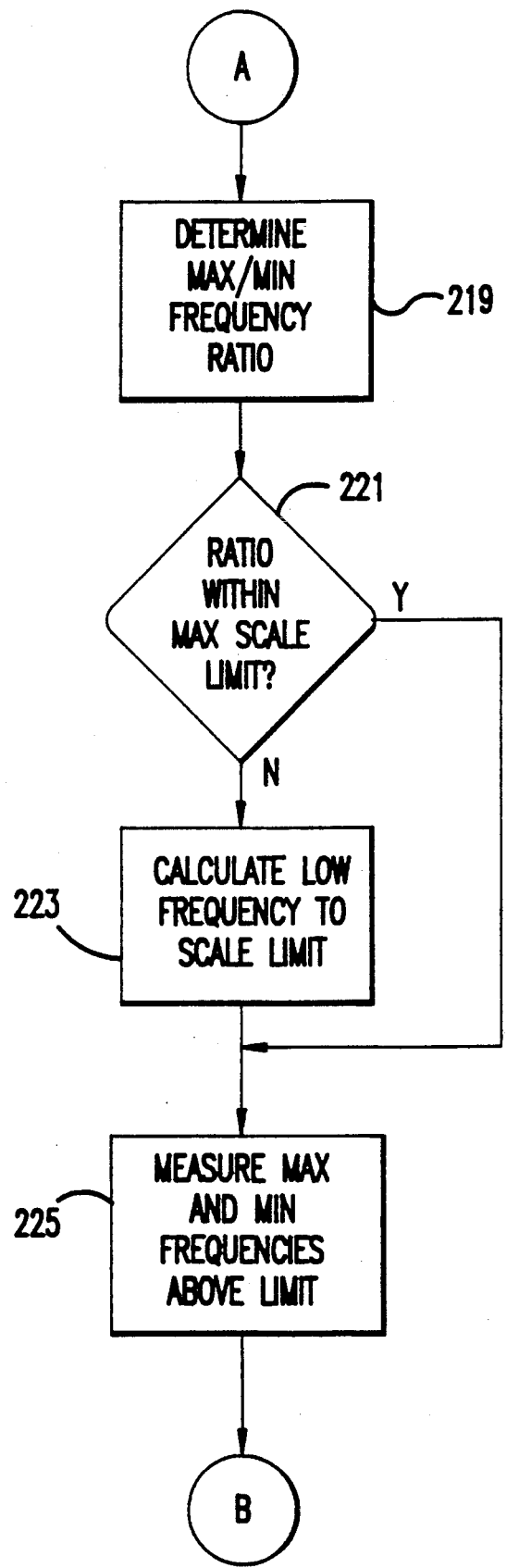

Next, referring to FIG. 3, in step 219, the processor determines the ratio of the maximum frequency to the minimum frequency. In step 221, the ratio is tested against the limit on the ratio of the top to bottom frequencies that can be used on the vertical scale of the display 103. If the ratio is within the scale limit, the process proceeds directly to step 225. If the ratio is not within the scale limit, step 223 calculates a minimum frequency that can be displayed, based on the maximum frequency detected and the scale limit.

In step 225, a new measurement is made in which all measured frequencies below this limit are ignored, and a new maximum and minimum are determined based only on those frequencies above this limit.

Figure 4:
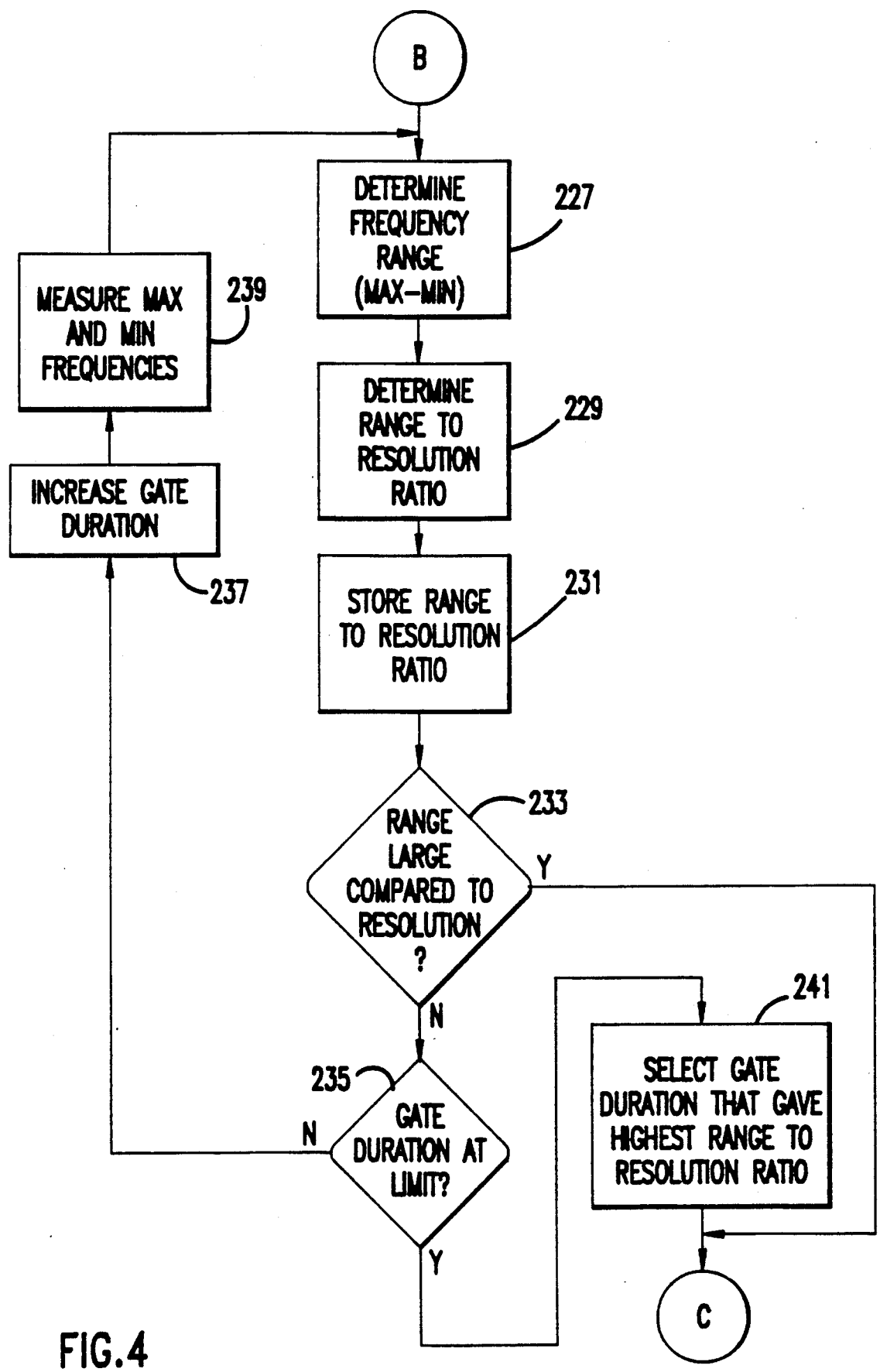

Steps 227 to 241, shown on FIG. 4, attempt to optimize the resolution of the measurement by adjusting the gate duration and monitoring the frequency range and the maximum and minimum frequencies measured. For signals with low level frequency modulation or noise, the inherent resolution uncertainty of measurements with a short duration gate may be a significant component of the apparent range between the minimum and maximum frequencies measured. increasing the gate duration (increasing the number of input cycles averaged for each measurement) to improve frequency measuring resolution risks averaging out the desired modulation or noise. Signals with lowe levels of high frequency modulation or noise may be impossible to measure with sufficient resolution to accurately view the variations.

In step 227, the frequency range, the difference between the maximum and the minimum frequency is determined. In step 229, the range to resolution ratio is determined. The resolution is proportional to the gate duration, with better resolution for longer gate duration. The range to resolution ratio is stored in step 231. In decision step 233, if the range is large compared to the resolution (ration is large), resolution is considered sufficient, and control flows directly to step 243.

If step 233 dinds the range close to the resolution, control proceeds to steps 235 to 241 to try to improve the measurement by changing the gate duration. As long as the gate duration is below the limit, checked in step 235, the gate duration is increased in step 237 and another measurement of minimum and maximum frequencies is made in step 239. Flow then proceeds through steps 227 to 233 to examine the rsulting range to resolution ratio.

If step 235 finds the gate duration at the limit, flow proceeds to step 241, where the stored range to resolution ratios are examined, and the gate duration set to the value that produced the highest range to resolution ratio, which is the optimum measurement setting for the input signal. From step 241, control flows to step 243, shown on FIG. 5, in which a measurement is made based on the final gate duration value. Steps 245 and 247, shown on FIG. 5, set the parameters of the vertical axis of display 103, based on the measured minimum and maximum frequencies. In step 245, the center value and the span of the display are set to display the measured frequencies on the middle half of the display. The procedure for this step is similar to the procedure followed for centering an oscilloscope display. In step 247, the display parameters are adjusted to rounded numbers if the result is a small movement of the position of the measurement values. Rounded numers have one or two significant figures.

The flow chart of FIG. 6 shows the operation of setting the horizontal scale (time per division) for display 103. First, at step 601, the range to resolution ratio is checked. If it is large, control flows to step 603 and a hysteresis band is set to ½ of the measured frequency range. If the ratio is not large, in step 605 the hysteresis band is set to 3/4 of the measured range.

From step 603 or 605, control flows to step 607, and a measurement is made for a set time duration (e.g. 250 millisec.) counting the positive crossings through the hysteresis band. From the crossings counted in a known time, the approximate period of the modulaton cycles is calculated in step 609.

Then, in step 611, the time scale is set to display approximately four modulation cycle periods. In the preferred embodiment, the time scale per division is adjusted to a number with one significant digit.

While there have been shown and described what are at present considered the preferred embodiments of the present invention, it will be obvious to those skilled in the art that various changes and modifications may be made therein without departing from the scope of the invention as defined by the appended claims.

I claim:

1. A method for examining an input signal an setting a frequency measuring instrument to a state which will produce a measurement and a display of the input signal, comprising:

finding the 50 percent voltage threshold for the input signal and setting the instrument for that voltage;

determining the minimum and maximum frequencies of the input signal.;

setting selected measurememnt parameters of the instrument near the optimum value for the measured minimum and maximum frequencies;

measuring the ratio of frequency range to frequency resolution, while varying selected measurement parameters of the instrument;

settig the varied parameters at values that produces a sufficient range to resolution ratio;

If no parameter values produce a sufficient range to resolution ratio, setting the varied parameters at the values that produced a maximum measured range to resolution ratio;

setting the display parameter values of the instrument based on the measured maximum and minimum frequencies of the input signal;

Setting a hysteresis band based on the range to resolution ratio;

making a measurement for a set time duration counting the positive crossings of the frequency of the input signal through the hysteresis band to determine approximately the period of the modulation of the input signal frequency; and setting the time scale display parameter values based on the approximate frequency modulation period.

2. A method for examining an input signal and setting a frequency measuring instrument to a state which will produce a measurement and a display of the input signal, comprising:

determining the minimum and maximum frequencies of the input signal;

setting selected measurement parameters of the instrument near the optimum value for the measure minimum and maximum frequencies;

measuring the ratio of frequency range to frequency resolution, while varying selected measurement parameters of the instrument;

setting the varied parameters at values that produces a sufficient range to resolution ratio;

if no parameter values produce a sufficient range to resolution ratio, setting the varied parameters at the values that produced a maximum measured range to resolution ratio;

setting the displat parameter values of the instrument based on the measured maximum and minimum frequencies of the input signal.

3. The method of claim 2 further comprising the steps of:

setting a hysteresis band based on the range to resolution ratio;

making a measurement for a set time duration counting the positive crossings of the frequency of the input signal through the hysteresis band to determine approximately the period of the modulation of the input signal frequency;

setting the time scale display parameter values based on the approximate frequency modulation period.

* * * * *